US 6,499,084 B2

(12) United States Patent
Kobayashi et al.

(10) Patent No.: US 6,499,084 B2
(45) Date of Patent: Dec. 24, 2002

(54) DIGITAL RECORDING AND REPRODUCING APPARATUS CAPABLE OF DETERMINING WHETHER DATA WAS REWRITTEN OR NOT

(75) Inventors: Nobuyuki Kobayashi, Tokyo (JP); Ken Fujii, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/945,791

(22) Filed: Sep. 5, 2001

(65) Prior Publication Data

US 2002/0032833 A1 Mar. 14, 2002

(30) Foreign Application Priority Data

Sep. 13, 2000 (JP) ........................................ 2000-277535

(51) Int. Cl.[7] .............................................. G06F 12/00
(52) U.S. Cl. ........................ 711/115; 711/154; 711/163; 711/170; 235/380
(58) Field of Search ................................ 711/115, 163, 711/164, 154, 170, 173; 235/380; 360/48; 700/94

(56) References Cited

U.S. PATENT DOCUMENTS

| | | | | |
|---|---|---|---|---|
| 5,392,166 A | * | 2/1995 | Furuya et al. ................. 360/57 |
| 5,860,135 A | * | 1/1999 | Sugita ......................... 711/115 |
| 5,898,884 A | * | 4/1999 | Tsukamoto ................... 711/103 |
| 6,212,331 B1 | * | 4/2001 | Fukuoka et al. ............. 386/107 |
| 6,275,451 B1 | * | 8/2001 | Park et al. ................ 369/47.15 |
| 6,286,087 B1 | * | 9/2001 | Ito et al. ...................... 711/111 |
| 2001/0042168 A1 | * | 11/2001 | Kubo .......................... 711/115 |
| 2002/0026564 A1 | * | 2/2002 | Kusakabe et al. ........... 711/147 |

FOREIGN PATENT DOCUMENTS

JP 7-200000 8/1995

OTHER PUBLICATIONS

English Language Abstract of JP 7-200000.

* cited by examiner

Primary Examiner—Hong Kim
(74) Attorney, Agent, or Firm—Greenblum & Bernstein, P.L.C.

(57) ABSTRACT

There is provided a digital recording and reproducing apparatus which is capable of determining whether or not recording data was rewritten, reliably and in a short time period without increasing manufacturing costs thereof. A digital recording and reproducing apparatus is configured to be capable of having a removable external memory mounted therein, for recording recording data in the external memory and reproducing a sound based on the recording data recorded in the external memory. An identification data-generating block generates identification data for use in determining whether or not the recording data was rewritten. An internal memory can record the identification data. A control block records the identification data in the external memory as part of the recording data and at the same time records the identification data in the internal memory such that the identification data is recorded in FAT data concerning the recording data in a manner correlated to a title of a file to be recorded therein. When the control block reads in the recording data from the external memory, if the identification data corresponding to the title of the file in the FAT data concerning the recording data read in from the external memory exists in the internal memory, the control block compares the existing identification data and the identification data recorded in the recording data read in with each other, and carries out predetermined processing if the compared identification data are different from each other.

15 Claims, 3 Drawing Sheets

DIGITAL RECORDING AND REPRODUCING APPARATUS CAPABLE OF DETERMINING WHETHER DATA WAS REWRITTEN OR NOT

BACKGROUND OF THE INVENTION

1. Field of the Invention

This invention relates to a digital recording and reproducing apparatus which is capable of recording and reproducing recorded data by using a removable external memory as a recording medium.

2. Description of the Related Art

As a digital recording and reproducing apparatus of the above-mentioned kind, a sound recording and reproducing apparatus is known which uses a card-type removable memory (hereinafter referred to as the "memory card") as a recording medium. In this sound recording and reproducing apparatus, an analog sound signal input via a microphone is subjected to analog-to-digital conversion to generate sound data, and the sound data is recorded in the memory card. In this case, in a sound recording and reproducing apparatus of this kind, generally, when production of sound data in a memory card has been completed, FAT (File Allocation Table) data of the sound data is recorded in a FAT data recording area of the memory card. On the other hand, when a sound is to be reproduced, sound data thereof is read out from the memory card in accordance with the FAT data, and then digital-to-analog conversion of the sound data is carried out to thereby generate an analog sound signal. This analog sound signal is sounded from a speaker or an earphone.

The above sound recording and reproducing apparatus, however, suffers from the following problems: In the sound recording and reproducing apparatus, a general-purpose memory card is employed as a recording medium for recording sound data. In this case, the memory card is configured such that it can be removed from the sound recording and reproducing apparatus and used in another sound recording and reproducing apparatus or a personal computer, and moreover such that it can reproduce a sound based on sound data and edit the sound data by using the apparatus or the personal computer. This makes it possible to dishonestly rewrite sound data recorded in the memory card. On the other hand, differently from analog sound data recorded by an analog recording and reproducing apparatus, digital sound data recorded by the digital recording and reproducing apparatus makes it difficult, for instance, even if part of the sound data was overwritten, to clearly recognize a boundary between original sound data originally recorded in the memory card and the overwritten sound data. Therefore, it is difficult for the conventional sound recording and reproducing apparatus to determine whether or not the present sound data is overwritten, and further whether or not the sound data is authentic.

In the above case, if part of sound data was overwritten in a quite normal fashion, FAT (File Allocation Table) data of the sound data is replaced by FAT data of new sound data, so that there is generated FAT data which is different from an original FAT data in date information and recording address information. Therefore, when sound data was recorded in the memory card, if FAT data of the sound data is caused to be stored in a built-in memory, and it is determined, when a sound is reproduced based on the sound data, whether or not FAT data items stored in the memory card and the built-in memory respectively are identical to each other, it is possible to determine whether or not the sound data was rewritten. However, since FAT data itself can be rewritten relatively easily, it is possible, for instance, to rewrite the sound data dishonestly to restore FAT data having the same contents with those of FAT data corresponding to the original sound data. This makes it difficult, when the FAT data was restored, to determine whether or not the sound data was rewritten in spite of the fact that the sound data was rewritten.

Further, to prevent sound data from being rewritten by a third party, there have been already devised a technique which records a predetermined user identification code in a memory card in advance such that only a sound recording and reproducing apparatus which first recorded sound data in the memory card can rewrite the sound data, and a technique which encrypts sound data per se to thereby disable rewriting of the sound data by another sound recording and reproducing apparatus. According to the former technique, rewriting of recording data can be prevented. However, it is required to record beforehand user identification codes different from each other in a manner associated with a corresponding one of a very large number of memory cards since it is necessitated to record a user identification code in each memory card in advance. Consequently, the user identification codes themselves become complicated and large-sized codes. Therefore, an important data recordable area of the memory card is occupied by the large-sized codes. Further, it takes a long time period to carry out identification processing for identification of a complicated and large-sized user identification code, and at the same time necessitates a sophisticated identification program and a high performance control section, which results in increased manufacturing costs of the sound recording and reproducing apparatus. On the other hand, the latter technique which encrypts sound data per se suffers from the problem that it takes a longer time period to carry out recording processing for recording sound data due to intricate encryption processing, and moreover it takes a longer time period to carry out reproduction processing for reproducing sound data due to decoding processing for decoding the encrypted sound data. Additionally, a sophisticated processing program for encrypting and decoding sound data and a high performance control section are necessitated.

SUMMARY OF THE INVENTION

It is a main object of the invention to provide a digital recording and reproducing apparatus which is capable of determining whether or not recording data was rewritten, reliably and in a short time period without increasing manufacturing costs thereof.

To attain the above object, the invention provides a digital recording and reproducing apparatus which is capable of having a removable external memory mounted therein, for performing recording of recording data in the external memory and reproduction based on the recording data recorded in the external memory, the digital recording and reproducing apparatus comprising an identification data-generating block for generating identification data for use in determining whether or not the recording data was rewritten, an internal memory in which the identification data can be recorded, and a control block for recording the identification data in the external memory as part of the recording data and at the same time recording the identification data in the internal memory in a manner correlated to a title of a file to be recorded in FAT data concerning the recording data, wherein when the control block reads in the recording data from the external memory, if the identification data corresponding to the title of the file in the FAT data concerning the recording data read in from the external memory exists in the internal memory, the control block compares the existing identification data and the identification data recorded in the recording data read in with each other, and carries out predetermined processing if the compared identification data are different from each other.

The digital recording and reproducing apparatus according to the invention includes the identification data-generating block for generating identification data, the internal memory in which the identification data can be recorded, and the control block for recording the identification data recorded in the external memory in the internal memory in a manner correlated to the title of the file of the recording data, and when the identification data corresponding to the title of the file of the recording data exists in the internal memory, the control block compares the two identification data recorded in the external memory and the internal memory, respectively, and carries out predetermined processing if the identification data are different from each other. This makes it possible to determine whether or not the recording data was rewritten, reliably and in a short time period although the apparatus is simple in construction, whereby it is possible to carry out suitable reproduction processing and notification processing for notifying the operator that the recording data has been rewritten, based on results of the determination. Further, differently from the method of fixedly recording an identification code beforehand in an external memory, it is possible to reduce the manufacturing costs of the external memory itself, and therefore it is possible to use an inexpensive memory available on the market as a recording medium.

In this case, it is preferred that the control block records the identification data in a header information recording portion of the recording data when the recording data is recorded in the external memory.

According to this preferred embodiment, the control block records the identification data in the header information recording portion of the recording data, whereby the identification data can be recorded in the recording data even immediately after the start of a recording process when the amount of the recording data per se is not finally determined. Further, during a reproduction process, it is possible to read out the identification data from the header information recording portion in a short time period to determine identity of the recording data, which makes it possible to shorten time periods required both for the recording process and the reproduction process.

Alternatively, it is preferred that the control block records the identification data in a data main body recording portion of the recording data when the recording data is recorded in the external memory.

According to this preferred embodiment, the control block records the identification data in the data main body recording portion of the recording data, whereby when compared with the method of recording identification data in the header information recording portion, it is difficult to locate the recording address of the identification data, thereby making it possible to prevent the identification data from being restored dishonestly after the recording data was rewritten. As a result, it can be determined reliably based on the above identification data whether or not the recording data was rewritten.

In this case, it is preferred that the identification data-generating block generates a plurality of items of the identification data according to an amount of the recording data, and wherein the control block scatteringly records the plurality of items of the identification data in the data main body recording portion, and at the same time records recording address information of the items of the identification data in the internal memory in a manner correlated to the title of the file of the recording data, and wherein when the recording data is read in from the external memory, the control block extracts the plurality of items of the identification data scatteringly recorded in the data main body recording portion of the recording data, based on the recording address information corresponding to the title of the file of the recording data, and compares each of the items of the identification data recorded in the internal memory in a manner correlated to the title of the file and each of the extracted items of the identification data, with each other.

According to this preferred embodiment, the identification data-generating block generates a plurality of items of the identification data according to the amount of the recording data. The control block scatteringly records the items of the identification data in the external memory such that the items of the identification data are scattered in the data main body recording portion, and records recording address information of the identification data in the internal memory in a manner correlated to the title of the file of the recording data, whereby e.g. when part of the recording data is rewritten, the identification data scatteringly recorded in the data main body recording portion is written over. Therefore, by comparing this identification data with the identification data recorded in the internal memory, it is possible to reliably determine whether or not the identification data was rewritten. Further, when compared with the method of recording a predefined number of items of the identification data, it is difficult to locate a recording address corresponding to an item of the identification data, thereby making it possible to reliably prevent the identification data from being restored dishonestly after the recording data was rewritten. Further, the method of fixedly defining the number of items of the identification data has points to be improved in that when the amount of recording data is small, the recording data is bloated by recording an unnecessarily large number of items of identification data at very short recording intervals in the recording data, whereas when the amount of recording data is large, it becomes difficult to reliably determine whether or not the recording data was partially rewritten since identification data is recorded at very large recording intervals in the recording data. In contrast, according to the digital recording and reproducing apparatus of the invention, the number of items of the identification data to be recorded is defined depending on the amount of recording data, whereby the recording data can be prevented from being bloated and at the same time it is possible to reliably determine whether or not the recording data was partially rewritten.

Further, it is preferred that the control block defines recording intervals of the plurality of items of the identification data in a random fashion and scatteringly records the plurality of items of the identification data in the data main body recording portion.

According to this preferred embodiment, the control block scatteringly records the plurality of items of the identification data at recording intervals defined in a random fashion, whereby when compared with a case in which recording intervals for recording identification data are defined in advance, it becomes more difficult to locate the recording address of the identification data, which makes it possible to reliably determine whether or not the identification data was restored dishonestly after the recording data had been rewritten, while reducing the amount of identification data.

Further, it is more preferred that when the compared identification data are determined to be different from each other, the control block notifies that the recording data read in from the external memory was rewritten, as the predetermined processing. In this case, it is more preferred that when the items of the identification data are determined to be identical to each other, the reproduction based on the recording data read in from the external memory is permitted without further processing.

According to this preferred embodiment, when the items of the identification data are different from each other, the control block notifies that the recording data was rewritten. As to recording data which was not rewritten, the reproduction process for reproducing the same can be continued without further processing, whereas when the recording data was rewritten, it is possible to notify the operator of the fact e.g. by displaying letters and symbols or delivering alerting sound, thereby stop the reproduction process.

Also, it is preferred that the identification data-generating block generates the identification data such that the identification data contains date information corresponding to a recording date of the recording data.

According to this preferred embodiment, the identification data-generating block the identification data such that the identification data contains date information corresponding to a recording date of the recording data, whereby compared with the method of recording, for instance, fixed numerical value information or the like as identification data, it becomes difficult to locate the recording address of the identification data, so that it is possible to determine more reliably whether or not the recording data was rewritten, although the apparatus is simple in construction.

Further, it is preferred that the identification data-generating block generates the identification data such that the identification data contains numerical value information generated in a random fashion.

According to this preferred embodiment, the identification data-generating block generates the identification data such that the identification data contains numerical value information generated in a random fashion, whereby compared with the method of recording, for instance, fixed numerical value information or the like as identification data, it becomes difficult to locate the recording address of the identification data, so that it is possible to determine more reliably whether or not the recording data was rewritten, and even if the recording data was recorded on the same date, it is possible to determine more reliably whether or not the recording data was rewritten, since it becomes less likely that items of identification data having the same information are generated.

Further, it is preferred that when the present apparatus is applied to a digital recording and reproducing apparatus configured to be capable of recording and reproducing sound data as the recording data, the digital recording and reproducing apparatus includes a sound signal input block for inputting an analog sound signal, a sound data-generating block for generating the sound data by converting the analog sound signal to digital data and compressing the digital data, a sound signal-generating block for decompressing the sound data recorded in the external memory to generate the digital data and converting the digital data to the analog sound signal, and an amplifier circuit for amplifying the converted analog sound signal to output the amplified sound signal.

According to this preferred embodiment, by applying the digital recording and reproducing apparatus according to the present invention to a voice recorder or the like for recording voice data or sound data which can be rewritten relatively easily, such that the apparatus is configured to be capable of recording and reproducing the voice data, it is possible to reliably determine whether or not the voice data was rewritten.

It should be noted that the disclosure of the present specification relates to the subjects included in Japanese Patent Application No. 2000-277535 which was filed with Japanese Patent Office on Sep. 13, 2000, and all of the disclosures thereby are expressly incorporated herein by reference.

BRIEF DESCRIPTION OF THE DRAWINGS

These and other objects and features of the present invention will be explained in more detail below with reference to the attached drawings, wherein.

DESCRIPTION OF THE PREFERRED EMBODIMENT

The invention will now be described in detail with reference to drawings showing a preferred embodiment thereof. In this embodiment, a digital recording and reproducing apparatus according to the invention is applied to a sound recording and reproducing apparatus 1.

First, the arrangement of the sound recording and reproducing apparatus 1 will be described with reference to FIG. 1 et seq.

Figure 1:
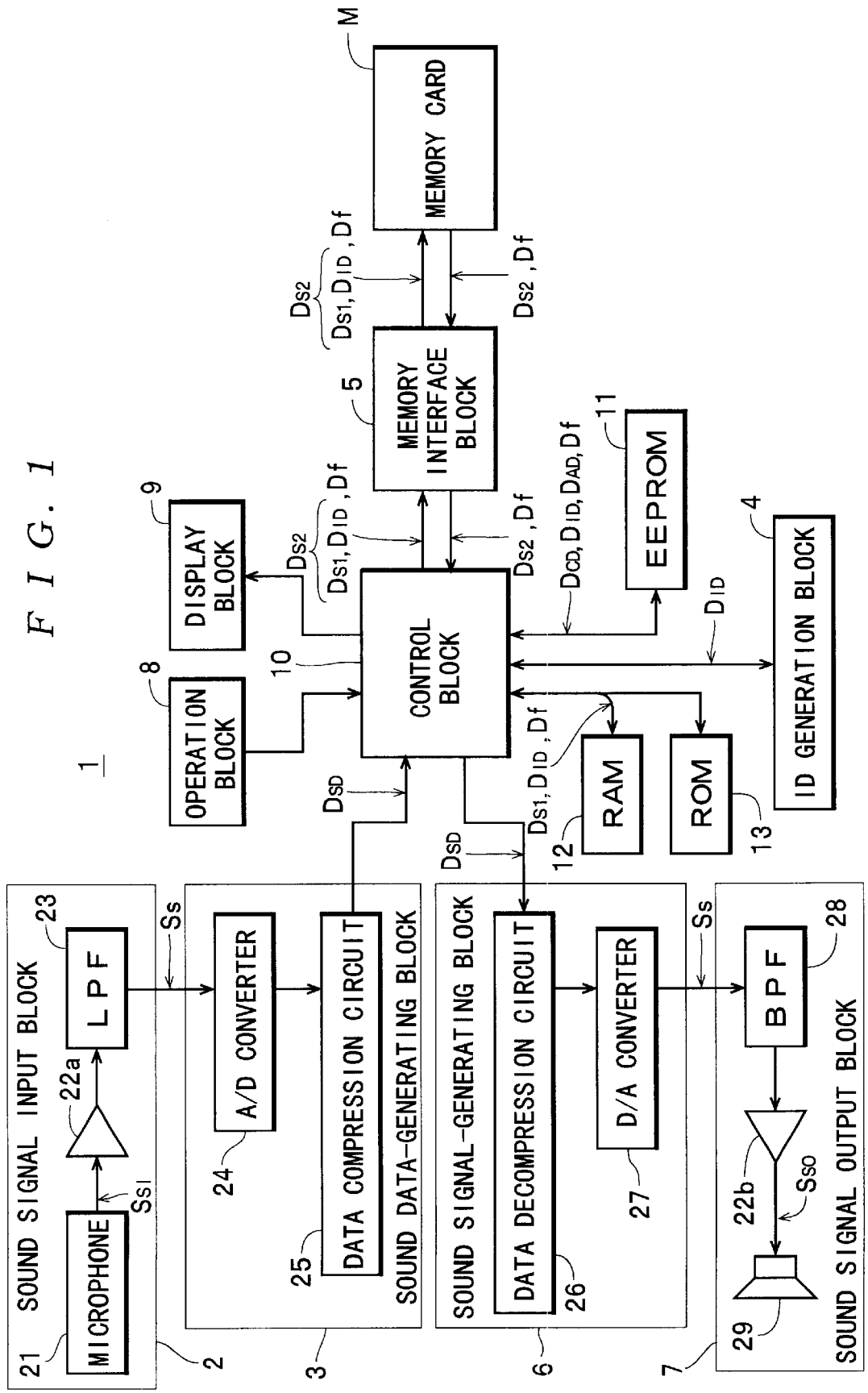
FIG. 1 is a block diagram showing the arrangement of a sound recording and reproducing apparatus according to an embodiment of the invention.
Figure 2:
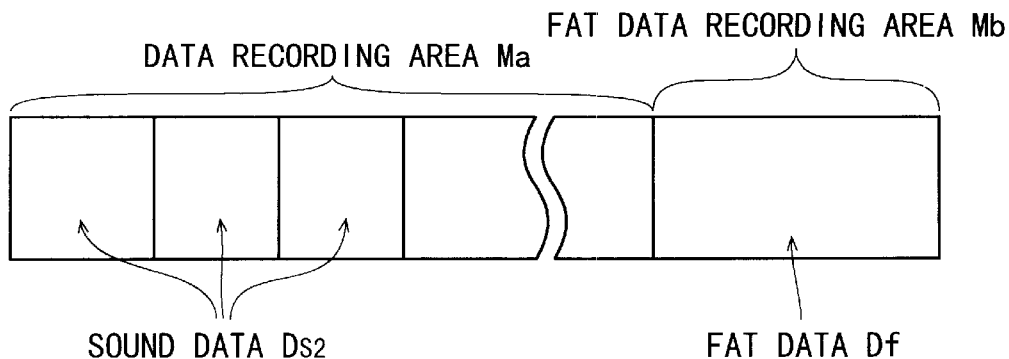
FIG. 2 is an area map showing an example of a recording area in a memory card M mounted in the sound recording and reproducing apparatus.
Figure 3:
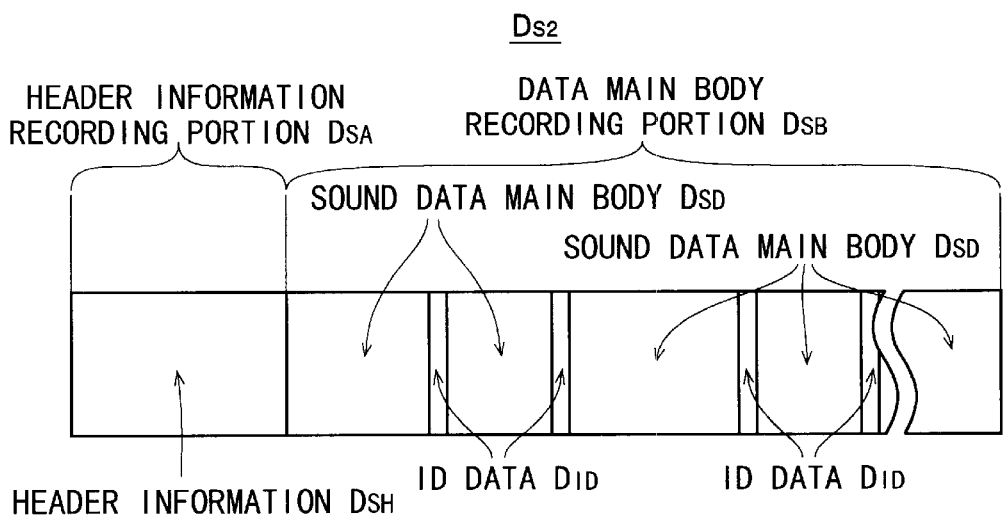
FIG. 3 is a data format diagram showing an example of a format of sound data DS2.

Referring to FIG. 1, the sound recording and reproducing apparatus 1 is a portable voice recorder which is configured to be capable of having a memory card M as a recording medium mounted therein, and performs not only recording of sound data (voice data) formed by converting an analog sound signal into digital data, in the memory card M, but also reproduction of an analog sound signal formed by converting sound data (voice data) recorded in the memory card M into analog data. The memory card M of this embodiment corresponds to an external memory of the invention, and is implemented by a versatile card-type removable memory in which a semiconductor device is sealed by a resin. Further, as shown in FIG. 2, the memory card M has a recording area divided into a data recording area Ma for recording sound data items DS2, DS2, . . . , and a FAT data recording area Mb for recording FAT data Df comprised of the title of the file, the recording date and recording address information of each sound data DS2, DS2, . . . It should be noted that as shown in FIG. 3, the sound data DS2 is formed as one file constituted by a header information recording portion DSA for recording header information DSH including the attribute of the file of the sound data DS2 and the title of the data DS2, and a data main body recording portion DSB for recording a sound data main body DSD corresponding to sound data of the present invention, and ID data items DID, DID . . . corresponding to identification data of the present invention.

On the other hand, as shown in FIG. 1, the sound recording and reproducing apparatus 1 includes a sound signal input block 2, a sound data-generating block 3, an ID generation block 4, a memory interface block 5, a sound signal-generating block 6, a sound signal output block 7, an operation block 8, a display block 9, a control block 10, an EEPROM 11, a RAM 12, and ROM 13.

The sound signal input block 2 is comprised of a microphone 21 for collecting sounds to output an analog sound signal SSI, an amplifier 22a for amplifying the input analog sound signal SSI to output the resulting signal, and an LPF 23 for subjecting the amplified analog sound signal SSI to low-pass filtration to thereby pass an analog sound signal Ss therethrough. The sound data-generating block 3 includes an A/D converter 24 for converting the analog sound signal Ss to digital data, and a data compression circuit 25 for compressing the digital data-into a sound data main body DSD. The ID generation block 4 corresponds to an identification data-generating block of the present invention, which generates numerical value data of approximately four bytes in total as ID data DID which is constituted by date information of e.g. two bytes corresponding to a recording date on which the sound data DS2 was recorded in the memory card M, numerical value information of e.g. one byte generated in a random fashion under the control of the control block 10, and file size data of one byte indicating, for instance, the size of the file of sound data DS1. In this embodiment, the ID generation block 4 generates, as numerical value information of one byte, a random number of one byte generated in a random fashion, or numerical value information formed by a combination of a password input by the operator in advance and a random number. The memory interface block 5 includes a connector capable of having the memory card M mounted therein, and executes recording of the sound data DS1, the ID data DID, and the FAT data Df in the memory card M under the control of the control block 10, and reading of the sound data DS2 formed of the sound data DS1 and the ID data DID and the FAT data Df from the memory card M.

The sound signal-generating block 6 includes a data decompression circuit 26 for decompressing the sound data main body DSD to decode the same into digital data, and a D/A converter 27 for converting the digital data into the analog sound signal Ss. The sound signal output block 7 includes a BPF 28 for filtering the analog sound signal Ss at a predetermined frequency band to generate an analog sound signal, an amplifier 22b for amplifying the analog sound signal output from the BPF 28 to output an analog sound signal SSO, and a speaker 29 for sounding tones based on the analog sound signal SSO. Further, the sound recording and reproducing apparatus 1 has an earphone jack, not shown, arranged therein, and when an earphone is connected to the earphone jack, tones are sounded based on the analog sound signal SSO from the earphone in place of the speaker 29.

On the operation block 8, there are arranged a plurality of operation buttons, such as a record button, a playback button, a fast forward button, a rewind button, a stop button, a menu button, a power button, and the like. The display block 9 is formed by an LCD panel for displaying the remaining recordable capacity of the memory card M, time elapsed from the start of recording/playback (reproduction) of a sound, various messages, the remaining capacity of a battery, not shown, and so forth. The control block 10 is implemented e.g. by a 16-bit CPU, and carries out control of the sound signal input block 2, the sound data-generating block 3, the ID generation block 4, the sound signal-generating block 6, and the sound signal output block 7, in response to operations of the buttons of the operation block 8, and control of recording in the memory card M via the memory interface block 5, and reading from memory card M. The EEPROM 11 corresponds to an internal memory of the present invention and stores the initialization data DCD of the sound recording and reproducing apparatus 1, the ID data DID generated by the ID generation block 4, ID data recording address information DAD, the FAT data Df, and so forth. The RAM 12 temporarily stores the sound data DS1, the ID data DID, the FAT data Df of the sound data DS1, which are being recorded in the memory card M, results of calculation carried out by the control block 10, etc. Further, the ROM 13 stores an operation program executed by the control block 10.

Next, the overall operation of the sound recording and reproducing apparatus 1 will be described in detail with reference to drawings.

First, the basic operation carried out by the sound recording and reproducing apparatus 1 will be described. In the sound recording and reproducing apparatus 1, when a power switch is turned on, the control block 10 reads out the initialization data DCD from the EEPROM 11, and after initialization of each circuit, causes the display block 9 to display an initial screen, not shown. Next, the control block 10 determines whether or not a memory card M is mounted in the memory interface block 5. At this time, if the control block 10 determines that there is no memory card M mounted in the memory interface block 5, it causes the display block 9 to display a message e.g. of "NO MEMORY CARD IS MOUNTED". On the other hand, if the control block 10 determines that a memory card M is mounted, the control block 10 obtains card information, such as the recordable capacity and remaining recordable capacity of the memory card M, from the memory card M by reading the FAT data Df from the FAT data recording area Mb, and causes the RAM 12 to store the card information. Then, the control block 10 calculates memory information, such as a recordable time based on the remaining recordable capacity, and causes the display block 9 to display the memory information.

Thereafter, the control block 10 monitors button operations in the operation block 8. When a button operation was detected, the control block 10 determines which button was operated. At this time, if the record button was operated, the control block 10 carries out a recording process, described hereinafter, whereas if the playback button was operated, the control block 10 carries out a reproduction process, described hereinafter. Further, if the menu button was operated, the control block 10 causes the display block 9 to display a menu screen for use in selecting a setting screen for setting the operating conditions of the sound recording and reproducing apparatus 1 and a function screen for using auxiliary functions, and carries out various setting processes e.g. for setting the operating conditions of the apparatus 1 in response to button operations in the operation block 8. On the other hand, if the power button was operated, the control block 10 deletes the display screen of the display block 9 and cuts off the power supply.

Figure 4:
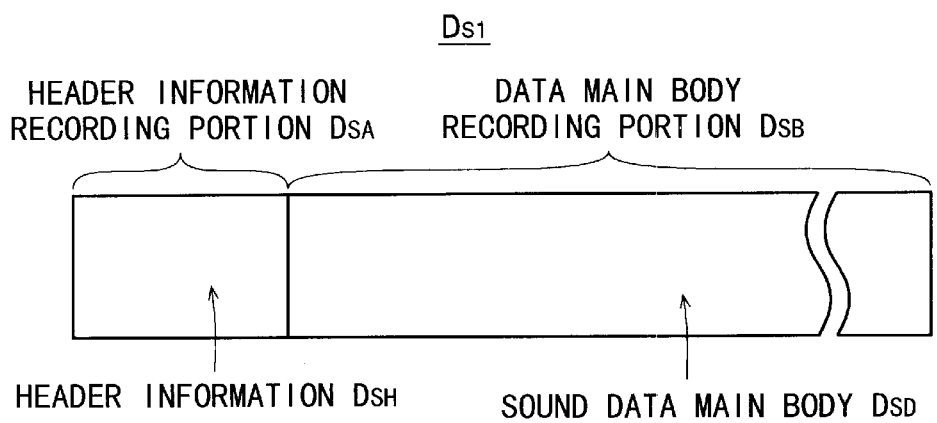
FIG. 4 is a data format diagram showing an example of a format of sound data DS1.

Next, the above-mentioned recording-process is described hereinafter. In this process, first, the control block 10 generates sound data DS1 based on the sound data main body DSD input via the sound signal input block 2 and generated by the sound data-generating block 3. More specifically, the amplifier 22a amplifies the analog sound signal SSI input through the microphone 21, and the LPF 23 filters the analog sound signal SSI to output an analog sound signal Ss. Next, the A/D converter 24 converts the analog sound signal Ss to digital data under the control of the control block 10, and the data compression circuit 25 compresses the digital data to generate a sound data main body DSD. Then, the control block 10 adds header information DSH, such as the attribute of the file of the sound data main body DSD and the title of the main body DSD, to the sound data main body DSD, to thereby generate sound data DS1. As shown in FIG. 4, the sound data DS1 of this embodiment is comprised of the header information recording portion DSA having the header information DSH recorded therein, and the data main body recording portion DSB having the sound data main body DSD recorded therein. Next, the control block 10 causes the sound data DS1 to be temporarily stored in the RAM 12. In the above process, at the time point the recording operation is started, the control block 10 adds the header information DSH concerning the sound data main body DSD to the 1-st to 90-th bytes of the sound data DS1, and adds the sound data main body DSD to the 91-th and following bytes of the sound data DS1 to thereby store the sound data DS1 in the RAM 12.

From this time on, the control block 10 continues to generate the sound data DS1 until the stop button is operated. In the meanwhile, the control block 10 reads out the sound data DS1 from the RAM 12, and sequentially records the same in the data recording area Ma of the memory card M via the memory interface block 5. At this time, the control block 10 records the title of the file, the recording date and the recording address information of the sound data DS1 recorded in the memory card M, as the FAT data Df, in the recording area of the RAM 12, and whenever the control block 10 records new sound data DS1 in the memory card M, it additionally records address information thereof in the FAT data Df. Further, while recording the sound data DS1, the control block 10 determines whether or not the recording operation was stopped by operating the stop button. If the recording operation was not stopped, the control block 10 determines whether or not the memory card M has been removed from the memory interface block 5. If the memory card M has not been removed, the control block 10 repeatedly carries out generation of the sound data DS1 and recording of the sound data DS1 in the memory card M, thereby sequentially recording the sound data DS1 corresponding to a sound collected by the microphone 21 in the data recording area Ma of the memory card M. On the other hand, if the control block 10 determines during the recording process that the memory card M has been removed, the control block 10 suspends the recording of the sound data DS1, and causes the display block 9 to display an error message e.g. of "MEMORY CARD IS REMOVED. MOUNT MEMORY CARD".

Next, if the stop button was operated, the ID generation block 4 generates a plurality of ID data items DID, DID . . . according to the amount of the sound data DS1 recorded in the memory card M, under the control of the control block 10. The control block 10 temporarily stores the ID data items DID, DID . . . in the RAM 12. At this time, the ID generation block 4 generates the number of ID data items DID, approximately proportional to the amount of the sound data DS1. More specifically, a large number of ID data items DID, DID . . . are generated for a large amount of sound data DS1, whereas a small number of ID data items DID, DID . . . are generated for a small amount of sound data DS1. In this case, a proportionality factor can be defined as desired. It is true that rewriting the ID data DID in a dishonest manner can be made more difficult as the number of the data items is increased, but if the number thereof becomes excessively large, the amount of the ID data DID is increased to thereby increase the amount of data to be processed. For instance, in recording sound data, if one ID data item DID of four bytes is to be recorded per second of the sound data DS1, the amount of the ID data DID becomes equal to 240 (4×60) bytes per minute of the sound data DS1. On the other hand, e.g. if one particular technique of various types of voice compression technologies already developed is adopted, the amount of the sound data DS1 becomes equal to a size of approximately 64000 bytes per minute. Therefore, in the above example, the recording of the ID data DID results in an increase of approximately 0.4% with respect to the amount (approximately 64000 bytes) of the sound data DS1. However, it is considered that the increase in amount of data to this extent is sufficiently small from a practical point of view, and hence it is preferable to adopt a proportionality factor to generate e.g. one or several ID data items DID per second of the sound data DS1.

Then, the control block 10 causes the ID data DID sequentially read in from the RAM 12 to be scatteringly recorded in the data main body recording portion DSB of the sound data DS1 in the memory card M at recording intervals set in a random fashion. In this case, the intervals for arranging the ID data DID to be recorded can be defined as desired. As described above, if one ID data item DID is recorded per second of sound data DS1, recording can be carried out, for instance, by the following method: By using a random number generator for generating numerical values from 1 to 256 in a random fashion, a lot of random numbers are generated sequentially and each random number is divided by a numerical value "128". At this time, the average value of the resulting values of the division ideally becomes equal to a value "1". Therefore, whenever the sound data DS1 is recorded by an amount corresponding to a time period (0.5 seconds if the resulting value is 0.5) obtained by dividing each random number generated by the random number generator, by the numerical value "128", an interrupt, such as a software interrupt, a timer interrupt, or the like, is generated, and each ID data item DID is recorded according to the interrupt. As a result, the ID data DID is recorded at randomly-determined time intervals of any multiples of $\frac{1}{128}$ second within a range of $\frac{1}{128}$ second to 2 seconds. It should be noted that if a 16-bit CPU operating on a 20-MHz clock is employed, generation processing for generating random numbers used in recording the ID data DID, recording processing for recording random number ID data DID in the RAM 12, generation processing for generating random numbers for use in defining recording intervals, the above arithmetic operations performed based on the generated random numbers for defining recording intervals, and ID data-transferring/recording processing for transferring the ID data DID from the RAM 12 to the memory card M to thereby record the ID data in the memory card M can be completed within one nano second. Therefore, as described above, while the control block 10 is recording the sound data DS1, it is possible to perform arithmetic operations for defining recording intervals by using the random number generator. Further, depending on the value of each random number generated, the amount of the sound data DS1 is not always proportional to the count of the ID data items DID. Accordingly, it is preferable to have generated beforehand the ID data items DID slightly larger in number than the number dependent on the proportionality factor. On the other hand, as described hereinabove, even if the ID data DID is generated whenever a recording interval is determined, the control block 10 can perform recording of the sound data DS1 sufficiently or positively in terms of time. Hence, it is also possible to determine a recording interval in advance, and generate ID data DID to record the sound data DS1 whenever the recording interval elapses.

It should be noted that when the respective 4-byte information items of the ID data items are compared with each other, 3-byte information items (2-byte date information and 1-byte file size data) are identical to each other, and only 1-byte numerical value information items generated in a random fashion are different from each other, so that the ID data items DID become identical to each other at a certain constant probability (1/256). However, this probability is small, and further, as described above, the ID data items DID are scatteringly recorded in the data main body recording portion DSB at recording intervals defined in a random fashion. Hence, it is difficult for even an operator with an advanced technique to identify even the existences of all the ID data items DID, and moreover, it is very difficult for him to identify all the locations where the ID data items DID exist. Hence, it is practically impossible to rewrite only the sound data DS1 without rewriting any of the ID data items DID, thereby making it possible to reliably determine whether or not the sound data DS1 was rewritten in a dishonest manner. As a result, a very practical data rewriting determination method can be realized while reducing the amount of the ID data DID used therefor.

Then, the control block 10 causes each of ID data recording address information items DAD indicative of addresses of the data recording area Ma where respective ID data items DID are recorded, to be associated with a corresponding one of the ID data item DID and sequentially recorded together with the corresponding ID data item DID in the EEPROM 11. At this time, the control block 10 sequentially and additionally records the recording address information of each ID data item DID, in the FAT data Df stored in the RAM 12, of the sound data DS1. It should be noted that in the embodiment of the invention, data formed by inserting the ID data items DID, DID . . . into the sound data main body DSD of the sound data DS1 is referred to as the "sound data DS2". Next, after completing the recording of the sound data DS2 in the memory card M while recording all the ID data items DID, DID . . . , the control block 10 then reads out FAT data Df (i.e. FAT data Df of the sound data DS2) formed by adding the recording address information of the ID data items DID, DID . . . to the FAT data Df of the sound data DS1, from the RAM 12 to record the same in the FAT data recording area Mb of the memory card M. Thereafter, the control block 10 records the FAT data Df in the EEPROM 11 such that the FAT data Df is correlated to the title of the file of the sound data DS2. Thus, the recording process is completed.

Next, the above-mentioned reproduction process will be described. In this process, first, the control block 10 reads the FAT data Df from the FAT data recording area Mb of the memory card M mounted in the memory interface block 5 to store the same in the RAM 12. Then, the control block 10 reads in each of the header information DSH, DSH . . . of the sound data items DS2, DS2 . . . in the data recording area Ma, to cause the display block 9 to display the list of the titles of the header information items DSH, DSH . . . Next, when the playback button of the operation block 8 is operated in a state of one of the titles being selected, the control block 10 determines whether or not the ID data items DID, DID . . . corresponding to the title of a file of the sound data DS2 named after the selected title are recorded in the EEPROM 11. If the ID data items DID, DID . . . are not recorded, the control block 10 determines that the ID data DID are not recorded in the sound data DS2, and reproduces the sound in an ordinary manner.

On the other hand, if the ID data DID corresponding to the title of the file are recorded in the EEPROM 11, the control block 10 determines whether or not the sound data DS2 was rewritten. More specifically, the control block 10 compares date information of the sound data DS2 in the FAT data Df, with date information in the FAT data Df correlated to the sound data DS2 and recorded in the EEPROM 11. In this embodiment, when a general operator rewrote the sound data DS2 in the memory card M by using a personal computer or another sound recording and reproducing apparatus, date information in the FAT data Df recorded in the memory card M is written to a date different from the date information stored in the FAT data Df when the sound data DS2 was first recorded. Therefore, when date information items in the FAT data Df, Df recorded respectively in the memory card M and the EEPROM 11 are different from each other, the control block 10 determines that the sound data DS2 was rewritten, and causes the display block 9 to display a message e.g. of "SOUND DATA IS REWRITTEN" (corresponding to "notifies that the recording data read in from the external memory was rewritten" in the present invention). At this time, when the playback button is operated again, the control block 10 reads out the sound data DS2 from the memory card M based on the recording address information in the FAT data Df, causes the sound signal-generating block 6 to generate an analog sound signal Ss, and causes the sound signal output block 7 to reproduce the sound.

More specifically, the control block 10 reads out the sound data DS2 from the memory card M, and transfers the sound data main body DSD which is formed by removing the header information DSH from the sound data DS2, to the data decompression circuit 26. At this time, the ID data items DID, DID . . . which during the above-mentioned recording process were recorded together with the sound data main body DSD in the data main body recording portion DSB, and at the same time were left in the data main body recording portion DSB without being overwritten by new sound data main body DSD when the sound data DS2 was rewritten, is transferred as part of the sound data main body DSD to the data decompression circuit 26. Next, the data decompression circuit 26 decompresses the sound data main body DSD to generate digital data, which is converted by the D/A converter 27 to the analog sound signal Ss. Then, the BPF 28 filters the analog sound signal Ss, the amplifier 22b amplifies the filtered analog sound signal Ss to generate an analog sound signal SSO, which is sounded from the speaker 29. Thus, a sound is reproduced based on the sound data DS2. At this time, the ID data DID transferred as part of the sound data main body DSD to the data decompression circuit 26 is reproduced as silence.

On the other hand, when the date information items in the FAT data Df, Df are compared with each other, if it is determined that the date information items are identical to each other, the control block 10 sequentially compares the ID data items DID, DID which were recorded together with the sound data main body DSD in the data recording area Ma, and the ID data items DID, DID . . . which were recorded in the EEPROM 11 in a manner correlated to the title of the file of the sound data DS2, with each other. More specifically, the control block 10 reads out the ID data recording address information DAD recorded in the EEPROM 11 to store the same in the RAM 12, and based on the address information, sequentially reads out the ID data items DID, DID . . . from the memory card M to store the same in the RAM 12. Then, the control block 10 compares each of the ID data items DID, DID . . . stored in the RAM 12, with each of the ID data items DID, DID . . . which were recorded in the EEPROM 11 in a manner correlated to the sound data DS2, one by one.

Figure 5:
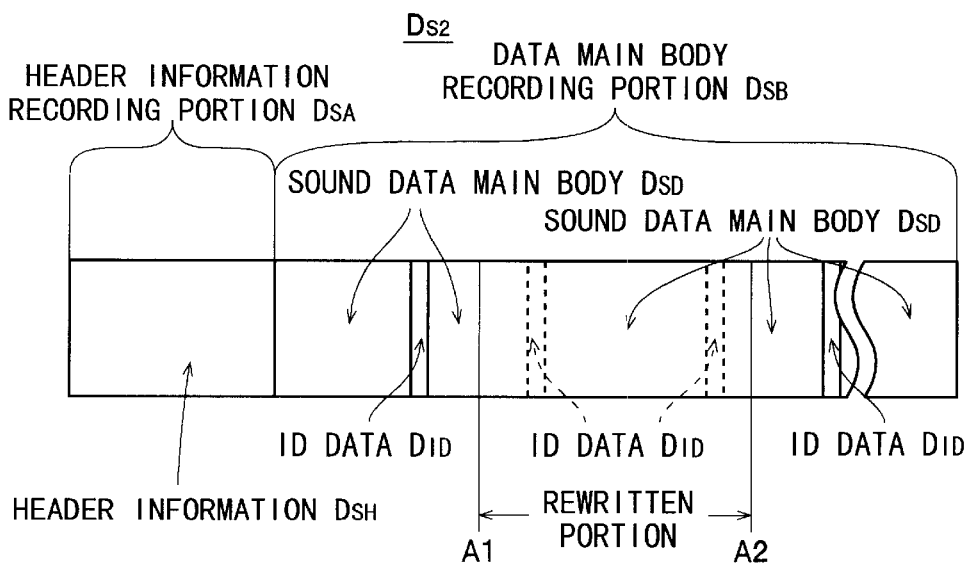
FIG. 5 is a data format diagram showing an example of the format of the sound data DS2 in which part of sound data main body DSD is rewritten.

In this case, as shown in FIG. 5, e.g. when the sound data main body DSD between A1 and A2 of the data main body recording portion DSB in the sound data DS2 was rewritten, the ID data DID, DID (indicated by broken lines) which had been recorded between A1 and A2 before the main body DSD was rewritten were deleted by writing new sound data main body DSD over the old main body DSD. Therefore, the ID data items DID, DID read in based on the ID data recording address information DAD are portions of a new sound data main body DSD overwritten by the rewriting, and hence the ID data items DID, DID are different in information from the ID data items DID, DID which was written when the sound data DS2 was first recorded. Thus, when the ID data items DID, DID . . . read in from the memory card M and stored in the RAM 12, and the ID data items DID, DID . . . recorded in the EEPROM 11 are different from each other, the control block 10 determines that the sound data DS2 was rewritten, and causes the display block 9 to display an error message e.g. of "SOUND DATA WAS REWRITTEN". At this time, when the playback button is operated again, the control block 10 reads out the sound data DS2 from the memory card M according to the FAT data Df read in from the memory card M, causes the sound signal-generating block 6 to generate an analog sound signal Ss, and causes the sound signal output block 7 to reproduce the sound. It should be noted in this case as well, the ID data items DID, DID . . . which remained recorded with no new sound data main body DSD being written thereover when the sound data DS2 was rewritten, are reproduced as silence.

Further, if it is determined that the ID data items DID, DID . . . recorded in the memory card M, and the ID data items DID, DID . . . recorded in the EEPROM 11 are identical to each other, the control block 10 reads out the sound data DS2 from the memory card M according to the FAT data Df which was read in from the memory card M and stored in the RAM 12, and causes the sound signal-generating block 6 and the sound signal output block 7 to carry out generation of an analog sound signal Ss and reproduction of the sound, respectively. At this time, the control block 10 reads out the sound data DS2 from the memory card M, removes the header information DSH from the sound data DS2, and then further removes the ID data items DID, DID . . . scatteringly recorded in the data main body recording portion DSB from the recording block DSB, thereby extracting the pure sound data main body DSD. The extracted sound data main body DSD is transferred to the sound signal-generating block 6. Consequently, the sound signal-generating block 6 generates an analog sound signal Ss, and the sound signal output block 7 generates an analog sound signal SSO for sounding tones from the speaker 29 based on the analog sound signal SSO. From this time on, reproduction of the sound is continued until the stop button is operated.

As described hereinabove, according to the sound recording and reproducing apparatus 1, when a sound is reproduced based on the sound data DS2, it is determined whether or not the date information items in the FAT data Df, Df recorded in the memory card M and the EEPROM 11, respectively, are identical to each other, whereby it can be determined in a relatively short time period whether or not the sound data DS2 was rewritten by a general operator with an ordinary technique. Further, according to the sound recording and reproducing apparatus 1, even if the sound data DS2 was rewritten, for instance, by an operator with an advanced technique who can restore the FAT data Df, by comparing a plurality of ID data items DID, DID . . . scatteringly recorded in the data main body recording portion DSB in a random fashion, with the ID data items DID, DID . . . recorded together with the ID data recording address information DAD in the EEPROM 11 in a manner correlated to the title of a file to be recorded in the FAT data Df of the sound data DS2, it is possible to reliably determine whether or not the sound data DS2 was rewritten. In this case, a plurality of ID data items DID, DID . . . are scatteringly recorded in a random fashion, whereby it is very difficult even for an operator with an advanced technique to identify the recording addresses of the ID data items DID, DID . . . This can make it practically impossible to restore the ID data items DID, DID . . . after the sound data DS2 has been rewritten. Therefore, it is possible to generate a sound data DS2 having a firmer security facility and an excellent admissibility of evidence.

Figure 6:
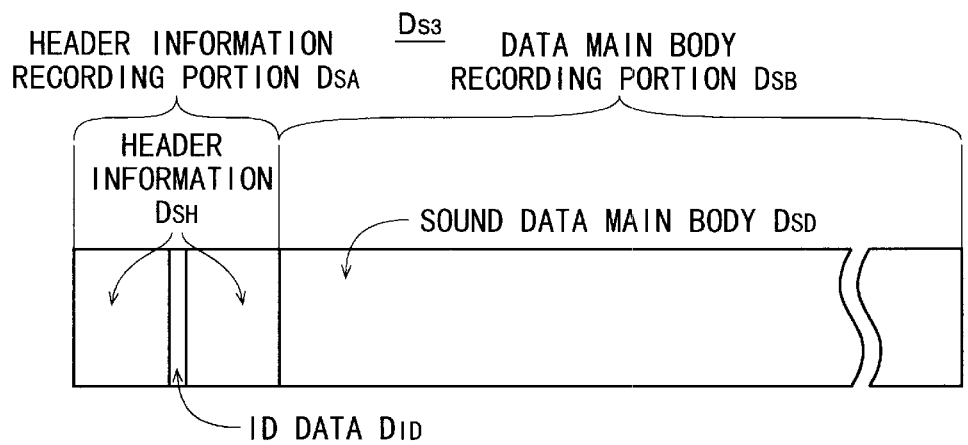
FIG. 6 is a data format diagram showing an example of a format of sound data DS3.
Figure 7:
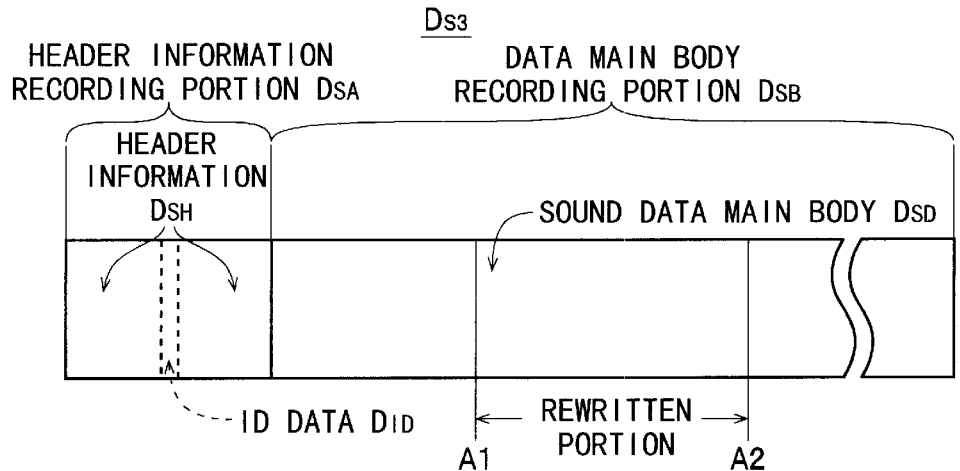
FIG. 7 is a data format diagram showing an example of the format of the sound data DS3 in which part of the sound data main body DSD is rewritten.

It should be noted that the present invention is not limited to the above embodiments, but the construction thereof can be modified as required. For instance, although in the above embodiment, a plurality of ID data items DID, DID . . . are recorded in the data main body recording portion DSB, the recording area for recording identification data according to the invention is not limited to the example illustrated in the embodiment. For instance, as in sound data DS3 shown in FIG. 6, ID data DID may be recorded together with header information DSH in a header information recording portion DSA. In this case, as shown in FIG. 7, if a sound data main body DSD between A1 and A2 was rewritten, the header information DSH is rewritten to be new header information DSH in accordance with the rewritten data, and ID data DID indicated by broken lines is rewritten to be a portion of the new header information. Consequently, the ID data DID becomes different from the ID data DID recorded in the EEPROM 11. According to this method of recording the ID data DID, irrespective of the recording capacity of the sound data DS3, the ID data DID can be recorded in the header information recording portion DSA at the time point the recording operation is started, so that it is possible to shorten a time period required for the ID data DID-recording process, and during the reproduction process, it is possible to determine in a shorter time period whether or not rewriting was carried out, in comparison with the method of extracting a plurality of ID data DID, DID for comparison.

Further, although in the embodiment of the invention, four-byte numerical value information is recorded as ID data DID, the details and amount of the identification data according to the invention are not limited to those shown in the embodiment. For instance, numerical value information given to each of sound recording and reproducing apparatuses 1, 1 . . . individually can be used as ID data DID, and numerical value information having the amount of data set depending on the processing capability of the control block 10 can be recorded as ID data DID. In this case, in the sound recording and reproducing apparatus 1 configured based on an assumption that a plurality of sound data DS2, DS2, . . . are recorded in one memory card M, it is preferable to use ID data DID formed of two bytes or more as a whole such that it can be determined on a data-by-data basis whether or not any of the sound data DS2, DS2, . . . were rewritten. Further, ID data DID of eight bytes or more takes somewhat longer time for generation and identification of the ID data, and such ID data DID becomes complicated, resulting in complication of a determination program. Therefore, it is preferable to use ID data DID of four bytes or a like size. Further, if the amount of ID data DID is defined depending on the processing capability of a CPU implementing the control block 10, it becomes possible to carry out high-speed determination processing based on the ID data DID.

Further, although in the embodiments of the invention, description was given based on the example in which a plurality of ID data items DID, DID are scatteringly recorded in the data main body recording portion DSB, this is not limitative, but, for instance, one ID data item DID (of four bytes) may be divided by one byte to distribute resulting 1-byte ID data items DID for recording in the data main body recording portion DSB. Further, the recording method according to the invention is not limited to the method of recording ID data DID at recording intervals defined in a random fashion, but the ID data DID can be recorded at fixed recording intervals. Further, for instance, it is possible to record every N (N is a natural number) words or every N sentences, or alternatively if there exists non-sounding data for duration of longer than a predetermined time period, it is possible to record ID data DID in the non-sounding data. Further, although in the embodiments of the invention, description was given based on the example in which ID data DID are recorded in the EEPROM 11 in a manner correlated to the title of a file to be recorded in the FAT data Df, this is not limitative, but it is possible to employ a method in which identification data are stored in the EEPROM 11 in a manner correlated to date information to be recorded in the FAT data Df, and when a sound is reproduced, if ID data DID corresponding to the same date information as that of the sound data DS2 to be reproduced has been recorded in the EEPROM 11, ID data DID in the data main body recording portion DSB read in and ID data DID recorded in the EEPROM 11 are compared with each other.

Further, although in the embodiments of the invention, the example of recording the sound data DS2 was described, this is not limitative, but it goes without saying that recording data in the present invention may be various digital data, including video data, numerical value data, text data, etc. Further, the sound data DS2 employed in the present invention includes not only the sound data DS2 which is generated by the analog-to-digital conversion of an analog sound signal Ss collected by the microphone 21 but also sound data which is generated based on a sound signal input via a sound signal input terminal, optical communication, and wireless communication, and sound data which is obtained through a communication terminal, and the like. Further, the external memory in the present invention includes not only the memory card M, but also various other removable memories (removable and rewritable storage mediums), such as bar-like and chip-like memories, and a disk-shaped digital data recording medium. Furthermore, the internal memory in the present invention as well includes not only the EEPROM 11, but also various other writable and readable memories, such as a RAM and the like. In this case, if FAT data Df, ID data DID, and ID data recording address information DAD recorded in the EEPROM 11 are configured to be transferable, it is possible to preserve numbers of FAT data Df, ID data DID, and ID data recording address information DAD exceeding in total amount of data the storage capacity of the EEPROM 11. Therefore, even if the EEPROM 11 is of a small capacity type, it is possible to determine as to a larger number of sound data DS2, DS2 . . . whether or not any of them was rewritten.

What is claimed is:

1. A digital recording and reproducing apparatus which is capable of having a removable external memory mounted therein, for performing recording of recording data in the external memory and reproduction based on the recording data recorded in the external memory, the digital recording and reproducing apparatus comprising:
an identification data-generating block for generating identification data for use in determining whether or not the recording data was rewritten;
an internal memory in which the identification data can be recorded; and
a control block for recording the identification data in the external memory as part of the recording data and at the same time recording the identification data in said internal memory in a manner correlated to a title of a file to be recorded in FAT data concerning the recording data,
wherein when said control block reads in the recording data from the external memory, if the identification data corresponding to the title of the file in the FAT data concerning the recording data read in from the external memory exists in said internal memory, said control block compares the existing identification data and the identification data recorded in the recording data read in with each other, and carries out predetermined processing if the compared identification data are different from each other.

2. A digital recording and reproducing apparatus according to claim 1, wherein said control block records the identification data in a header information recording portion of the recording data when the recording data is recorded in the external memory.

3. A digital recording and reproducing apparatus according to claim 1, wherein said control block records the identification data in a data main body recording portion of the recording data when the recording data is recorded in the external memory.

4. A digital recording and reproducing apparatus according to claim 3, wherein said identification data-generating block generates a plurality of items of the identification data according to an amount of the recording data, and wherein said control block scatteringly records the plurality of items of the identification data in the data main body recording portion, and at the same time records recording address information of the items of the identification data in said internal memory in a manner correlated to the title of the file of the recording data, and wherein when the recording data is read in from the external memory, said control block extracts the plurality of items of the identification data scatteringly recorded in the data main body recording portion of the recording data, based on the recording address information corresponding to the title of the file of the recording data, and compares each of the items of the identification data recorded in said internal memory in a manner correlated to the title of the file and each of the extracted items of the identification data, with each other.

5. A digital recording and reproducing apparatus according to claim 4, wherein said control block defines recording intervals of the plurality of items of the identification data in a random fashion and scatteringly records the plurality of items of the identification data in the data main body recording portion.

6. A digital recording and reproducing apparatus according to claim 1, wherein when the compared identification data are determined to be different from each other, said control block notifies that the recording data read in from the external memory was rewritten, as the predetermined processing.

7. A digital recording and reproducing apparatus according to claim 1, wherein said identification data-generating block generates the identification data such that the identification data contains date information corresponding to a recording date of the recording data.

8. A digital recording and reproducing apparatus according to any one of claim 6, wherein said identification data-generating block generates the identification data such that the identification data contains date information corresponding to a recording date of the recording data.

9. A digital recording and reproducing apparatus according to claim 1, wherein said identification data-generating block generates the identification data such that the identification data contains numerical value information generated in a random fashion.

10. A digital recording and reproducing apparatus according to any one of claim 6, wherein said identification data-generating block generates the identification data such that the identification data contains numerical value information generated in a random fashion.

11. A digital recording and reproducing apparatus according to any one of claim 7, wherein said identification data-generating block generates the identification data such that the identification data contains numerical value information generated in a random fashion.

12. A digital recording and reproducing apparatus according to claim 1, configured to be capable of recording and reproducing sound data as the recording data, the digital recording and reproducing apparatus including a sound signal input block for inputting an analog sound signal, a sound data-generating block for generating the sound data by converting the analog sound signal to digital data and compressing the digital data, a sound signal-generating block for decompressing the sound data recorded in the external memory to generate the digital data and converting the digital data to the analog sound signal, and an amplifier circuit for amplifying the converted analog sound signal to output the amplified sound signal.

13. A digital recording and reproducing apparatus according to any one of claim 6, configured to be capable of recording and reproducing sound data as the recording data, the digital recording and reproducing apparatus including a sound signal input block for inputting an analog sound signal, a sound data-generating block for generating the sound data by converting the analog sound signal to digital data and compressing the digital data, a sound signal-generating block for decompressing the sound data recorded in the external memory to generate the digital data and converting the digital data to the analog sound signal, and an amplifier circuit for amplifying the converted analog sound signal to output the amplified sound signal.

14. A digital recording and reproducing apparatus according to any one of claim 7, configured to be capable of recording and reproducing sound data as the recording data, the digital recording and reproducing apparatus including a sound signal input block for inputting an analog sound signal, a sound data-generating block for generating the sound data by converting the analog sound signal to digital data and compressing the digital data, a sound signal-generating block for decompressing the sound data recorded in the external memory to generate the digital data and converting the digital data to the analog sound signal, and an amplifier circuit for amplifying the converted analog sound signal to output the amplified sound signal.

15. A digital recording and reproducing apparatus according to any one of claim 8, configured to be capable of recording and reproducing sound data as the recording data, the digital recording and reproducing apparatus including a sound signal input block for inputting an analog sound signal, a sound data-generating block for generating the sound data by converting the analog sound signal to digital data and compressing the digital data, a sound signal-generating block for decompressing the sound data recorded in the external memory to generate the digital data and converting the digital data to the analog sound signal, and an amplifier circuit for amplifying the converted analog sound signal to output the amplified sound signal.

* * * * *